US009792851B2

(12) United States Patent
Lou

(10) Patent No.: US 9,792,851 B2
(45) Date of Patent: Oct. 17, 2017

(54) GATE DRIVE CIRCUIT, ARRAY SUBSTRATE, DISPLAY PANEL AND DISPLAY DEVICE

(71) Applicants: Shanghai Tianma Micro-Electronics Co., Ltd., Shanghai (CN); Tianma Micro-Electronics Co., Ltd., Shenzhen (CN)

(72) Inventor: Tenggang Lou, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 291 days.

(21) Appl. No.: 14/694,954

(22) Filed: Apr. 23, 2015

(65) Prior Publication Data

US 2016/0187917 A1   Jun. 30, 2016

(30) Foreign Application Priority Data

Dec. 29, 2014   (CN) .......................... 2014 1 0848213

(51) Int. Cl.
*G09G 3/36*   (2006.01)
*G09G 3/20*   (2006.01)
(Continued)

(52) U.S. Cl.
CPC ......... *G09G 3/2096* (2013.01); *G09G 3/3266* (2013.01); *G09G 3/3677* (2013.01);
(Continued)

(58) Field of Classification Search
CPC .. G09G 3/2096; G09G 3/3677; G09G 3/3266; G09G 2310/0286;
(Continued)

(56) References Cited

U.S. PATENT DOCUMENTS 7,738,622 B2 *  6/2010  Cho .................... G09G 3/3677
                                              377/64
7,907,113 B2 *  3/2011  Jang ................... G09G 3/3607
                                              345/100
(Continued)

FOREIGN PATENT DOCUMENTS

CM   103035218 A   4/2013
CN   102723064 A   10/2012
(Continued)

*Primary Examiner* — Rodney Amadiz
(74) *Attorney, Agent, or Firm* — Anova Law Group, PLLC

(57) ABSTRACT

A gate drive circuit is disclosed. The gate drive circuit includes shift register units connected with gate lines. The gate drive circuit also includes clock signal lines to provide clock signals. A trigger signal terminal of the first shift register unit is connected with a first initial trigger signal line, and a trigger signal terminal of the p-th shift register unit is connected with an output terminal of the (p−1)-th shift register unit. An end signal terminal of the r-th shift register unit is connected with an output terminal of the $(r+2^{M-1})$-th shift register unit, low level signal terminals are connected with a first low level signal line, and reset signal terminals are connected with a reset signal line. In addition, forward scan signal terminals are connected with a first scan signal line, and backward scan signal terminals are connected with a second scan signal line.

13 Claims, 9 Drawing Sheets

(51) Int. Cl.
*G09G 3/3266* (2016.01)
*G11C 19/28* (2006.01)

(52) U.S. Cl.
CPC .......... *G11C 19/28* (2013.01); *G11C 19/287* (2013.01); *G09G 2300/0408* (2013.01); *G09G 2300/0426* (2013.01); *G09G 2310/0213* (2013.01); *G09G 2310/0286* (2013.01); *G09G 2310/08* (2013.01)

(58) Field of Classification Search
CPC ....... G09G 2300/0408; G09G 2310/08; G09G 2310/0213; G09G 2300/0426; G11C 19/28; G11C 19/38; G11C 19/287
USPC .......................................... 345/98, 100, 204
See application file for complete search history.

(56) References Cited

U.S. PATENT DOCUMENTS

| | | | |
|---|---|---|---|
| 8,107,586 B2* | 1/2012 | Shin | G09G 3/3677 377/64 |
| 8,159,446 B2* | 4/2012 | Lee | G09G 3/3677 345/100 |
| 9,218,780 B2* | 12/2015 | Chen | G09G 3/3266 |
| 9,437,325 B2* | 9/2016 | Qian | G11C 19/184 |
| 2006/0001638 A1* | 1/2006 | Jeon | G09G 3/3677 345/100 |
| 2008/0036725 A1 | 2/2008 | Lee et al. | |
| 2015/0187323 A1* | 7/2015 | Jin | G09G 5/003 345/215 |
| 2016/0321978 A1* | 11/2016 | Chang | G09G 3/3648 |

FOREIGN PATENT DOCUMENTS

| | | |
|---|---|---|
| CN | 103400559 A | 11/2013 |
| CN | 103730093 A | 4/2014 |
| CN | 103927960 A | 7/2014 |
| CN | 103985363 A | 8/2014 |
| CN | 104183225 A | 12/2014 |

* cited by examiner

GATE DRIVE CIRCUIT, ARRAY SUBSTRATE, DISPLAY PANEL AND DISPLAY DEVICE

CROSS-REFERENCES TO RELATED APPLICATIONS

This application claims the benefit of priority to Chinese Patent Application No. 201410848213.X, filed with the Chinese Patent Office on Dec. 29, 2014 and entitled "GATE DRIVE CIRCUIT, ARRAY SUBSTRATE, DISPLAY PANEL AND DISPLAY DEVICE", the content of which is incorporated herein by reference in its entirety.

FIELD OF THE INVENTION

The present disclosure relates to the field of display technologies and particularly to a gate drive circuit, an array substrate, a display panel and a display device.

BACKGROUND OF THE INVENTION

A Liquid Crystal Display (LCD) or an Organic Light-Emitting Diode (OLED) has taken the place of a traditional Cathode Ray Tube (CRT) display gradually in some applications due to its low radiation, small volume, low power consumption and other advantages and thus has been widely applied to a notebook PC, a Personal Digital Assistant (PDA), a flat panel TV set, a mobile phone and other information products. The traditional liquid crystal display displays an image by driven a chip on a panel using an external drive chip, but in order to lower the number of elements and the production cost, the drive circuit has been developed gradually in recent years by being fabricated directly on the display panel, for example, in such a scheme that a gate drive circuit is integrated on a Gate On Array (GOA).

However with the existing GOA scheme applied to the display panel, there may be complicated wires, and a large number of initial trigger signal lines, between respective shift registers of the gate drive circuit, so that a significant wire space has to be taken up.

BRIEF SUMMARY OF THE INVENTION

One inventive aspect is a gate drive circuit. The gate drive circuit includes N shift register units, each of which is connected with one of N gate lines of a display panel respectively. The gate drive circuit also includes $2^M$ clock signal lines configured to provide the N shift register units with clock signals. N is an even number. M is a natural number larger than or equal to 2. A trigger signal terminal of the first shift register unit is connected with a first initial trigger signal line, and a trigger signal terminal of the p-th shift register unit is connected with an output terminal of the (p−1)-th shift register unit, where p=2, 3, . . . , N. An end signal terminal of the r-th shift register unit is connected with an output terminal of the $(r+2^{M-1})$-th shift register unit, where r=1, 2, . . . , $N-2^{M-1}$, a plurality of low level signal terminals of the shift register units are connected with a first low level signal line, and a plurality of reset signal terminals of the shift register units are connected with a reset signal line. In addition, forward scan signal terminals of the shift register units are connected with a first scan signal line, and backward scan signal terminals of the shift register units are connected with a second scan signal line.

Another inventive aspect is an array substrate, including a display area, and a non-display area surrounding the display area. N gate lines are arranged in the display area, and a gate drive circuit is arranged in the non-display area. The gate drive circuit includes N shift register units, each of which is connected with one of N gate lines of a display panel respectively. The gate drive circuit also includes $2^M$ clock signal lines configured to provide the N shift register units with clock signals. N is an even number. M is a natural number larger than or equal to 2. A trigger signal terminal of the first shift register unit is connected with a first initial trigger signal line, and a trigger signal terminal of the p-th shift register unit is connected with an output terminal of the (p−1)-th shift register unit, where p=2, 3, . . . , N. An end signal terminal of the r-th shift register unit is connected with an output terminal of the $(r+2^{M-1})$-th shift register unit, where r=1, 2, . . . , $N-2^{M-1}$, a plurality of low level signal terminals of the shift register units are connected with a first low level signal line, and a plurality of reset signal terminals of the shift register units are connected with a reset signal line. In addition, forward scan signal terminals of the shift register units are connected with a first scan signal line, and backward scan signal terminals of the shift register units are connected with a second scan signal line.

Another inventive aspect is a display panel, including an array substrate, where the array substrate includes a display area and a non-display area surrounding the display area. N gate lines are arranged in the display area, and a gate drive circuit is arranged in the non-display area. The gate drive circuit includes N shift register units, each of which is connected with one of N gate lines of a display panel respectively. The gate drive circuit also includes $2^M$ clock signal lines configured to provide the N shift register units with clock signals. N is an even number. M is a natural number larger than or equal to 2. A trigger signal terminal of the first shift register unit is connected with a first initial trigger signal line, and a trigger signal terminal of the p-th shift register unit is connected with an output terminal of the (p−1)-th shift register unit, where p=2, 3, . . . , N. An end signal terminal of the r-th shift register unit is connected with an output terminal of the $(r+2^{M-1})$-th shift register unit, where r=1, 2, . . . , $N-2^{M-1}$, a plurality of low level signal terminals of the shift register units are connected with a first low level signal line, and a plurality of reset signal terminals of the shift register units are connected with a reset signal line. In addition, forward scan signal terminals of the shift register units are connected with a first scan signal line, and backward scan signal terminals of the shift register units are connected with a second scan signal line.

Another inventive aspect is a display device, including a display panel, where the display panel includes an array substrate, where the array substrate includes a display area and a non-display area surrounding the display area. N gate lines are arranged in the display area, and a gate drive circuit is arranged in the non-display area. The gate drive circuit includes N shift register units, each of which is connected with one of N gate lines of a display panel respectively. The gate drive circuit also includes $2^M$ clock signal lines configured to provide the N shift register units with clock signals. N is an even number. M is a natural number larger than or equal to 2. A trigger signal terminal of the first shift register unit is connected with a first initial trigger signal line, and a trigger signal terminal of the p-th shift register unit is connected with an output terminal of the (p−1)-th shift register unit, where p=2, 3, . . . , N. An end signal terminal of the r-th shift register unit is connected with an output terminal of the $(r+2^{M-1})$-th shift register unit, where $r=1, 2, \ldots, N-2^{M-1}$, a plurality of low level signal terminals of the shift register units are connected with a first low level signal line, and a plurality of reset signal terminals of the shift register units are connected with a reset signal line. In addition, forward scan signal terminals of the shift register units are connected with a first scan signal line, and backward scan signal terminals of the shift register units are connected with a second scan signal line.

DETAILED DESCRIPTION OF THE INVENTION

Figure 1:
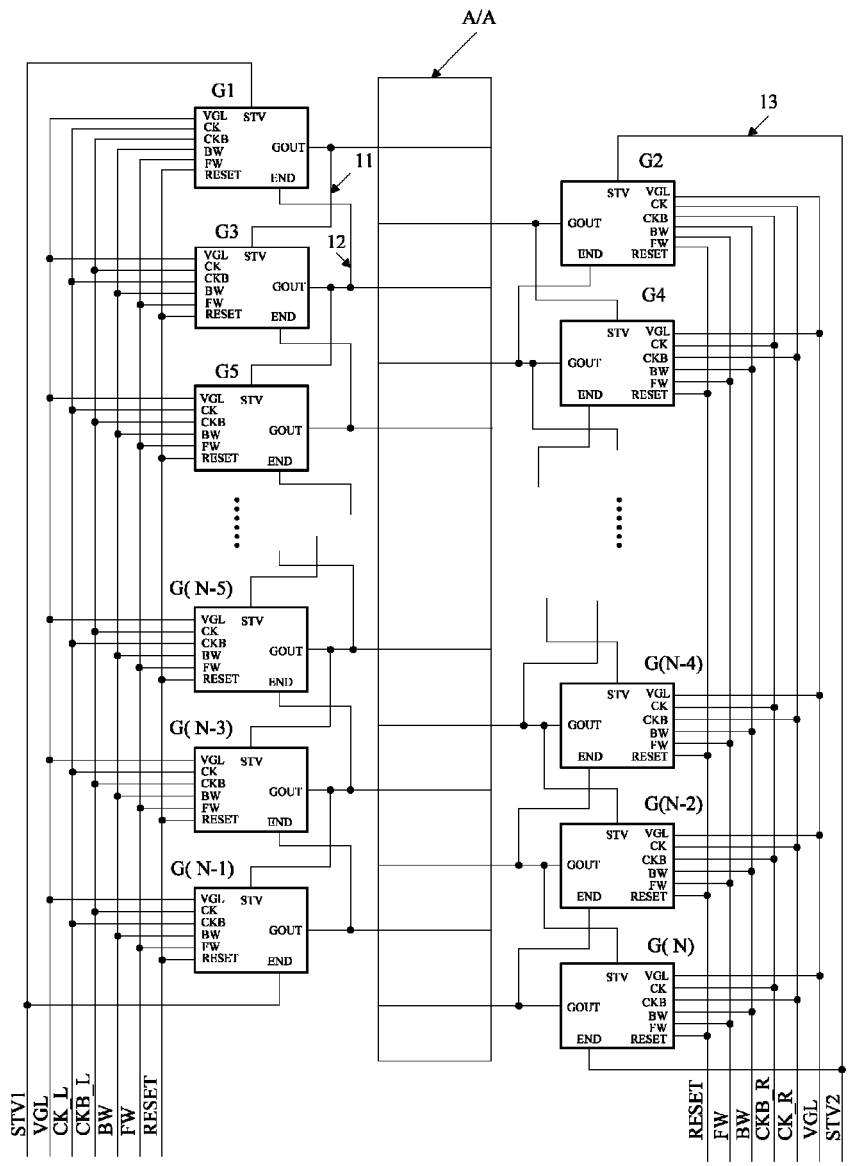
FIG. 1 illustrates a schematic diagram of a bi-sided driven gate drive circuit controlled by a 4-phase clock signal in the related art.

Implementations of embodiments of the disclosure will be described below in details with reference to the drawings. It shall be noted that identical or like reference numerals throughout the drawings denote identical or like units or functionally identical or like units. The embodiments described below with reference to the drawings are illustrative and merely intended to explain the disclosure but not construed to limit the disclosure.

An embodiment of the disclosure provides a gate drive circuit including N shift register units, each of which is connected with one of N gate lines of a display panel respectively, and $2^M$ clock signal lines configured to provide the N shift register units with clock signals, where N is an even number, and M is a natural number larger than or equal to 2; and A trigger signal terminal of the first shift register unit is connected with a first initial trigger signal line, and a trigger signal terminal of the p-th shift register unit is connected with an output terminal of the (p−1)-th shift register unit, where $p=2, 3, \ldots, N$; an end signal terminal of the r-th shift register unit is connected with an output terminal of the $(r+2^{M-1})$-th shift register unit, where $r=1, 2, \ldots, N-2^{M-1}$; low level signal terminals of the respective shift register units are connected with a first low level signal line, and reset signal terminals of the respective shift register units are connected with a reset signal line; and forward scan signal terminals of the respective shift register units are connected with a first scan signal line, and backward scan signal terminals of the respective shift register units are connected with a second scan signal line, and a first scan signal on the first scan signal line is opposite in phase to a second scan signal on the second scan signal line.

Preferably a first signal terminal of the k-th shift register unit is connected with the $\mod(\mod(k-1)/2^M)/2^M)$-th clock signal line, and a second signal terminal of the k-th shift register unit is connected with the $\mod((\mod(k-1)/2^M + 2^{M-1})/2^M)$-th clock signal line, where $k=1, 2, 3, \ldots, N$.

Preferably the clock signal on the i-th clock signal line lags the clock signal on the (i−1)-th clock signal line by more than $\frac{1}{2}^M$ clock cycle and less than one clock cycle, where $i=1, 2, \ldots, 2^{M-1}$.

Preferably there are a high level signal on the first scan signal line and a low level signal on the second scan signal line in a forward scan.

Preferably the end signal terminals of the last $2^{M-1}$ shift register units of the gate drive circuit are connected with the first initial trigger signal line.

In this embodiment, the trigger signal terminal of the p-th shift register unit is connected with the output terminal of the (p−1)-th shift register unit, and the end signal terminal of the r-th shift register unit is connected with the output terminal of the $(r+2^{M-1})$-th shift register unit, so that the number of initial trigger signal lines can be lowered and a wire space taken up by a signal line on which a trigger signal is passed between one shift register unit and another shift register unit dependent thereupon can be saved.

In order to describe the effect of saving a wire space in the gate drive circuit according to this embodiment of the disclosure, a gate drive circuit in the prior art will be compared therewith below taking a gate drive circuit with a 4-phase clock signal as an example:

The bi-sided driven gate drive circuit in the prior art as illustrated in FIG. 1 includes N shift register units, each of which is connected with respective one of N gate lines of a display panel, and a trigger signal terminal of each other shift register unit than the first two shift register units (a shift register unit G1 and a shift register unit G2 as illustrated in FIG. 1) with their trigger signal terminals connected with a first initial trigger signal STV1 receives a signal output terminal by the second shift register unit preceding to the shift register unit; first clock signal terminals CK of the shift register units connected with the odd gate lines are connected with a clock signal CK_L, and second clock signal terminals CKB of these shift register units are connected with a clock signal CKB_L, and first clock signal terminals CK of the shift register units connected with the even gate lines are connected with a clock signal CK_R, and second clock signal terminals CKB of these shift register units are connected with a clock signal CKB_R; and low level signal terminals VGL of the respective shift register units receive a low level signal VGL, and reset signal terminals RESET of the respective shift register unit receive a reset signal RESET. As can be apparent from FIG. 1, there are two necessary wires, referred to as a trigger signal line 11 and an end signal line 12 respectively, between the respective shift register units and a display area A/A; and there is also a necessary initial trigger signal line STV2 (referred to as 13) to the right of the display area A/A.

Figure 2:
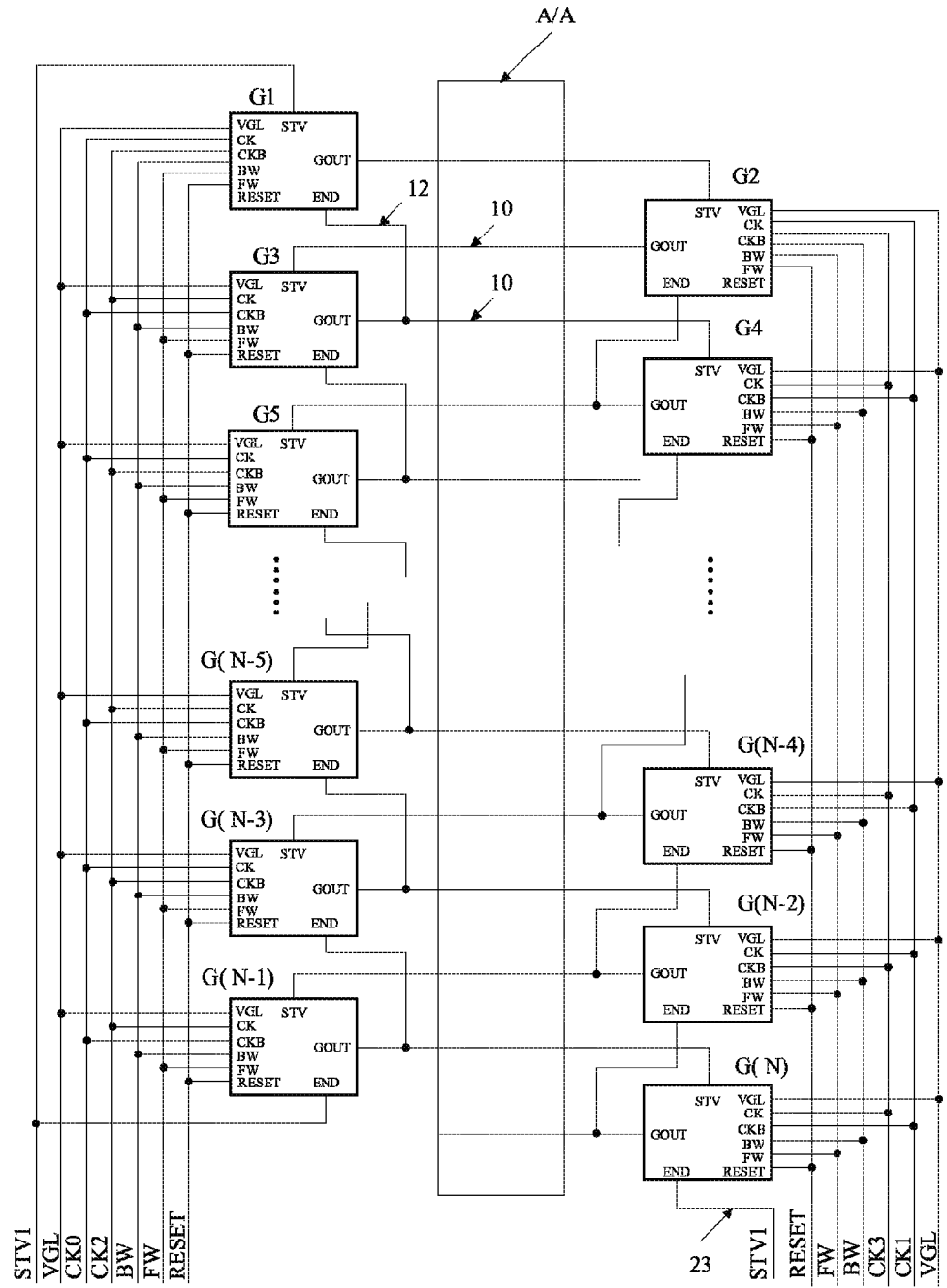
FIG. 2 illustrates a schematic diagram of a bi-sided driven gate drive circuit controlled by a 4-phase clock signal according to an embodiment of the disclosure.

Referring to FIG. 2, a bi-sided driven gate drive circuit with a 4-phase clock signal according to an embodiment of the disclosure includes N shift register units, each of which is connected with respective one of N gate lines 10 of a display panel, a trigger signal terminal STV of the first shift register unit G1 is connected with a first initial trigger signal line STV1, a trigger signal terminal STV of the second shift register unit G2 is connected with an output terminal GOUT of the first shift register unit G1, a trigger signal terminal STV of the third shift register unit G3 is connected with an output terminal GOUT of the second shift register unit G2, . . . , and so on until a trigger signal terminal STV of the N-th shift register unit G(N) is connected with an output terminal GOUT of the (N−1)-th shift register unit G(N−1); an end signal terminal END of the first shift register unit G1 is connected with the output terminal GOUT of the third shift register unit G3, an end signal terminal END of the second shift register unit G2 is connected with the output terminal GOUT of the fourth shift register unit G4, . . . , and so on until a trigger signal terminal STV of the (N−2)-th shift register unit G(N−2) is connected with an output terminal GOUT of the N-th shift register unit G(N); low level signal terminals VGL of the respective shift register units are connected with a first low level signal line VGL, and reset signal terminals RESET of the respective shift register units are connected with a reset signal line RESET; and forward scan signal terminals FW of the respective shift register units are connected with a first scan signal line FW, and backward scan signal terminals BW of the respective shift register units are connected with a second scan signal line BW. In FIG. 2, both the N-th shift register unit G(N) and the (N−1)-th shift register unit G(N−1) are disabled by the initial trigger signal line STV1, and the current shift register unit is triggered by the output terminal of the preceding shift register unit through the gate line 10. Thus with the number of clock signal lines (e.g., altogether four clock signal lines including the zero-th clock signal line CK0, the first clock signal line CK1, the second clock signal line CK2, and the third clock signal line CK3) being unchanged, in the gate drive circuit with a 4-phase clock signal in FIG. 2 according to this embodiment of the disclosure as compared with the gate drive circuit in the prior art as illustrated in FIG. 1, the initial trigger signal line STV2 (referred to as 13 in FIG. 1) can be dispensed with, and the segment of the initial trigger signal line STV1 (referred to as 23 in FIG. 2) to disable the N-th shift register unit only needs to take up a smaller wire space; and moreover a trigger signal can be passed on the gate lines 10 to thereby dispense with the trigger signal line 11 as illustrated in FIG. 1.

Figure 3:
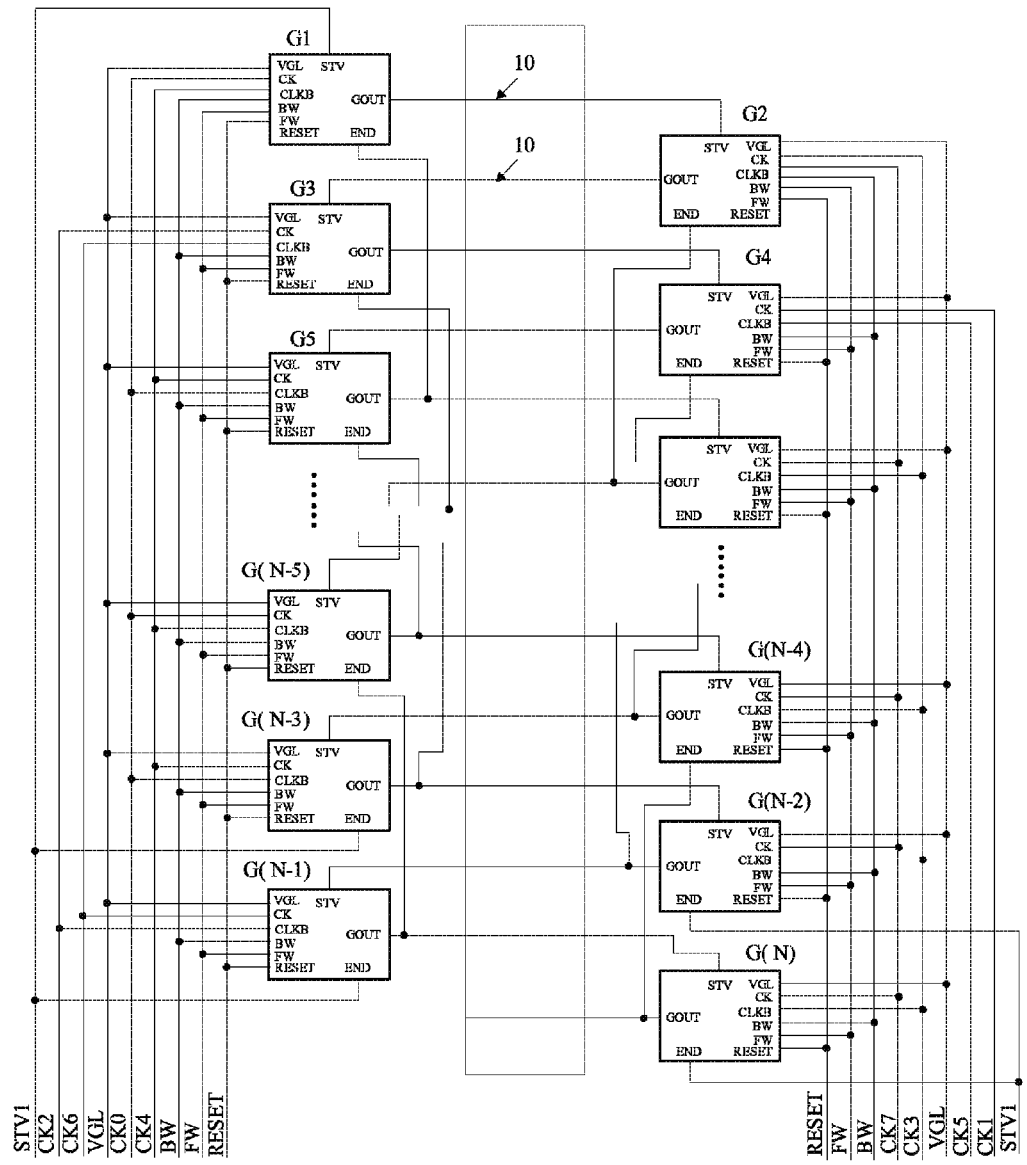
FIG. 3 illustrates a schematic diagram of a bi-sided driven gate drive circuit controlled by an 8-phase clock signal according to an embodiment of the disclosure.

The gate drive circuit according to the embodiment of the disclosure is driven by a 2M-phase clock signal, e.g., a 4-phase clock signal as illustrated in FIG. 2 or an 8-phase clock signal as illustrated in FIG. 3. The clock signals in FIG. 2 and FIG. 3 will be described as follows:

In the bi-sided driven gate drive circuit controlled by a 4-phase clock as illustrated in FIG. 2, the number of phases of the clock signal is $2^M=4$, where $2^M$ can be divided by N without any remainder, and M=2. A first signal terminal of the k-th shift register unit is connected with the mod(mod$(k-1)/2^M)/2^M$)-th clock signal line, and a second signal terminal of the k-th shift register unit is connected with the mod((mod$(k-1)/2^M+2^{M-1})/2^M$)-th clock signal line, where k=1, 2, 3, . . . , N. For example, the first signal terminal CK of the first shift register unit G1 receives the zero-th clock signal CK0, the first signal terminal CK of the second shift register unit G2 receives the first clock signal CK1, the first signal terminal CK of the third shift register unit G3 receives the second clock signal CK2, the first signal terminal CK of the fourth shift register unit G4 receives the third clock signal CK3, the first signal terminal CK of the fifth shift register unit G5 receives the zero-th clock signal CK0, . . . , and so on until the first signal terminal CK of the N-th shift register unit G(N) receives the third clock signal CK3; and the second signal terminal CKB of the first shift register unit G1 receives the second clock signal CK2, the second signal terminal CKB of the second shift register unit G2 receives the third clock signal CK3, the second signal terminal CKB of the third shift register unit G3 receives the zero-th clock signal CK0, the second signal terminal CKB of the fourth shift register unit G4 receives the first clock signal CK1, the second signal terminal CKB of the fifth shift register unit G5 receives the third clock signal CK3, . . . , and so on until the second signal terminal CKB of the N-th shift register unit G(N) receives the first clock signal CK1.

The i-th clock signal lags the (i−1)-th clock signal by more than $½^M$ clock cycle and less than one clock cycle, where i=1, 2, . . . , $2^{M-1}$, that is, the first clock signal CK1 lags the zero-th clock signal CK0 by more than ¼ clock cycle, the second clock signal CK2 lags the first clock signal CK1 by more than ¼ clock cycle, and the third clock signal CK3 lags the second clock signal CK2 by more than ¼ clock cycle.

The low level signal terminals VGL of the respective shift register units are connected with the first low level signal line VGL, and the reset signal terminals RESET of the respective shift register units are connected with the reset signal line RESET; and the forward scan signal terminals FW of the respective shift register units are connected with the first scan signal line FW, and the backward scan signal terminals BW of the respective shift register units are connected with the second scan signal line BW. For example there are a high level signal on the first scan signal line FW and a low level signal on the second scan signal line BW in a forward scan.

It shall be noted that the last $2^{M-1}$ shift register units need to be provided with a separate end signal together, for example, with M=2, in order to disable the (N−1)-th shift register unit G(N−1) and the N-th shift register unit G(N), the end signal terminals END of the (N−1)-th shift register unit G(N−1) and the N-th shift register unit G(N) can be connected with the first initial trigger signal line STV1. Of course, if wires do not need to be saved, then the (N−1)-th shift register unit G(N−1) and the N-th shift register unit G(N) can alternatively be provided respectively with respective end signal lines, but a repeated description thereof will be omitted here.

Referring to FIG. 3, there is illustrated a schematic structural diagram of a first bi-sided driven gate drive circuit controlled by a 8-phase clock signal according to an embodiment of the disclosure, where the gate drive circuit includes N shift register units, each of which is connected with respective one of N gate lines 10 of a display panel, and N is an even number; and the number of phases of the clock signal is $2^M=8$, i.e., M=3, and $2^M$ can be divided by N without any remainder, that is N can be divided 8 without any remainder. A first signal terminal CK of the k-th shift register unit is connected with the mod(mod$(k-1)/2^M)/2^M$)-th clock signal line, and a second signal terminal of the k-th shift register unit is connected with the mod((mod$(k-1)/2^M+2^{M-1})/2^M$)-th clock signal line, where k=1, 2, 3, . . . , N. For example, the first signal terminal CK of the first shift register unit G1 receives the zero-th clock signal CK0, the first signal terminal CK of the second shift register unit G2 receives the first clock signal CK1, the first signal terminal CK of the third shift register unit G3 receives the second clock signal CK2, the first signal terminal CK of the fourth shift register unit G4 receives the third clock signal CK3, the first signal terminal CK of the fifth shift register unit G5 receives the fourth clock signal CK4, the first signal terminal CK of the sixth shift register unit G6 receives the fifth clock signal CK5, the first signal terminal CK of the seventh shift register unit G7 receives the sixth clock signal CK6, the first signal terminal CK of the eighth shift register unit G8 receives the seventh clock signal CK7, . . . , and so on until the first signal terminal CK of the N-th shift register unit G(N) receives the seventh clock signal CK7; and the second signal terminal CKB of the first shift register unit G1 receives the fourth clock signal CK4, the second signal terminal CKB of the second shift register unit G2 receives the fifth clock signal CK5, the second signal terminal CKB of the third shift register unit G3 receives the sixth clock signal CK6, the second signal terminal CKB of the fourth shift register unit G4 receives the seventh clock signal CK7, the second signal terminal CKB of the fifth shift register unit G5 receives the zero-th clock signal CK0, the second signal terminal CKB of the sixth shift register unit G6 receives the first clock signal CK1, the second signal terminal CKB of the seventh shift register unit G7 receives the second clock signal CK2, the second signal terminal CKB of the eighth shift register unit G8 receives the third clock signal CK3, . . . , and so on until the second signal terminal CKB of the N-th shift register unit G(N) receives the third clock signal CK3.

The i-th clock signal lags the (i–1)-th clock signal by more than $\frac{1}{2}^M$ clock cycle and less than one clock cycle, where i=1, 2, . . . , $2^{M-1}$, that is, the first clock signal CK1 lags the zero-th clock signal CK0 by more than ¼ clock cycle, the second clock signal CK2 lags the first clock signal CK1 by more than ¼ clock cycle, and the third clock signal CK3 lags the second clock signal CK2 by more than ¼ clock cycle.

The initial signal terminal STV of the first shift register unit G1 receives the first initial trigger STV1. The initial signal terminal of the p-th shift register unit is connected with the output terminal of the (p–1)-th shift register unit, where p=2, 3, . . . , N. For example, the initial signal terminal STV of the second shift register unit G2 is connected with the output terminal GOUT of the first shift register unit G1, the initial signal terminal STV of the third shift register unit G3 is connected with the output terminal GOUT of the second shift register unit G2, . . . , and so on until the initial signal terminal STV of the N-th shift register unit G(N) is connected with the output terminal GOUT of the (N–1)-th shift register unit G(N–1).

The end signal terminal END of the r-th shift register unit is connected with the output terminal GOUT of the $(r+2^{M-1})$-th shift register unit, where r=1, 2, . . . , N–2, that is, the end signal terminal END of the first shift register unit G1 is connected with the output terminal GOUT of the third shift register unit G3, the end signal terminal END of the second shift register unit G2 is connected with the output terminal GOUT of the fourth shift register unit G4, . . . , and so on until the end signal terminal END of the (N–2)-th shift register unit G(N–2) is connected with the output terminal GOUT of the N-th shift register unit G(N).

The low level signal terminals VGL of the respective shift register units are connected with the first low level signal line VGL, and the reset signal terminals RESET of the respective shift register units are connected with the reset signal line RESET; and The forward scan signal terminals FW of the respective shift register units are connected with the first scan signal line FW, and the backward scan signal terminals BW of the respective shift register units are connected with the second scan signal line BW. For example there are a high level signal on the first scan signal line FW and a low level signal on the second scan signal line BW in a forward scan.

In the gate drive circuit according to the embodiment of the disclosure as illustrated in FIG. 3 as compared with the prior art, a part of the original trigger signal lines or wire space can be dispensed with, and also a wire space taken up by a signal line on which a trigger signal is passed between one shift register unit and another shift register unit dependent thereupon can be saved.

It shall be noted that the last $2^{M-1}$ shift register units need to be provided with a separate end signal together, for example, with M=3, in order to disable the (N–3)-th shift register unit G(N–3) and the (N–2)-th shift register unit G(N–2), the end signal terminals END of the (N–3)-th shift register unit G(N–3) and the (N–2)-th shift register unit G(N–2) can be connected with the first initial trigger signal line STV1, and furthermore the end signal terminals END of the (N–1)-th shift register unit G(N–1) and the N-th shift register unit G(N) can be connected with the first initial trigger signal line STV1. Of course, if wires do not need to be saved, then the last $2^{M-1}$ shift register units can alternatively be provided respectively with respective end signal lines, but a repeated description thereof will be omitted here.

For scheme diagrams of more bi-sided driven gate drive circuit controlled by a multi-phase clock signal, reference can be made to variants of the bi-sided driven gate drive circuit controlled by a 4-phase clock signal as illustrated in FIG. 2 and the bi-sided driven gate drive circuit controlled by an 8-phase clock signal as illustrated in FIG. 3, and since the same principle holds true for them, a repeated description thereof will be omitted here. It shall be noted that in the bi-sided driven gate drive circuit controlled by a multi-phase clock signal, the trigger signal terminal of the p-th shift register unit receives an output terminal signal from the output terminal of the (p–1)-th shift register unit through the (p–1)-th gate line.

Additionally based upon the gate drive circuit in the prior art as illustrated in FIG. 1, the trigger signal terminal of the N-th shift register unit receives a signal output terminal from the (N–2)-th shift register unit, so when the (N–2)-th shift register unit starts to output terminal, the N-th shift register unit starts to be charged for a period of time which is the sum of the durations of signals output terminal from the (N–2)-th shift register unit and the (N–1)-th shift register unit. As can be apparent, the N-th shift register unit is charged for a long period of time, and the (N–2)-th shift register unit with larger power consumption output terminals a trigger signal of the N-th shift register unit. In the gate drive circuit according to the embodiment of the disclosure, the trigger signal terminal of the p-th shift register unit receives an output terminal signal from the output terminal of the (p–1)-th shift register unit, so that each shift register unit is charged for a shorter period of time, and as compared with driving every other row in the prior art, the shift register units can be charged at a high level for a shorter period of time to thereby greatly lower the power consumption. Details thereof will be given as follows.

Firstly the respective shift register units will be described.

Figure 4:
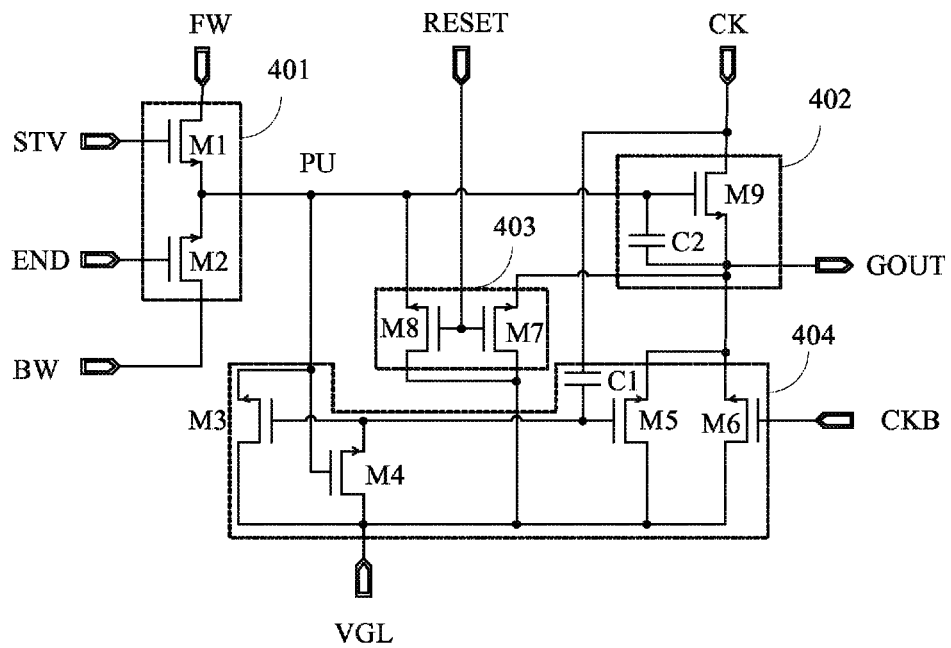
FIG. 4 illustrates a schematic diagram of a shift register unit according to an embodiment of the disclosure.

As illustrated in FIG. 4, each shift register unit includes a drive module 401, an output terminal module 402, a rest module 403 and a pull-down module 404, where:

A first terminal of the drive module 401 is the forward scan signal terminal FW of the shift register unit, a second terminal of the drive module 401 is a trigger signal terminal STV of the shift register unit, a third terminal of the drive module 401 is the end signal terminal END of the shift register unit, a fourth terminal of the drive module 401 is the backward signal terminal of the shift register unit, and a fifth terminal of the drive module 401 is connected with the second terminal of the output terminal module 402;

A first terminal of the output terminal module 402 is the first signal terminal CK of the shift register unit, and a third terminal of the output terminal module 402 is the output terminal GOUT of the shift register unit;

A first terminal of the reset module 403 is the third terminal of the output terminal module 402, a second terminal of the reset module 403 is the reset signal terminal RESET of the shift register unit, a third terminal of the reset module 403 is connected with the second terminal of the output terminal module 402, and a fourth terminal of the reset module 403 is connected with the second terminal of the pull-down module 404; and A first terminal of the pull-down module 404 is connected with the second terminal of the output terminal module 402, a second terminal of the pull-down module 404 is the low-level signal terminal VGL of the shift register unit, a third terminal of the pull-down module 404 is the second signal terminal CKB of the shift register unit, a fourth terminal of the pull-down module 404 is connected with the third terminal of the output terminal module 402, and a fifth terminal of the pull-down module 404 is connected with the first terminal of the output terminal module 402.

The respective modules above function particularly as follows:

The drive module 401 is configured to output terminal a signal received at the forward scan signal terminal FW through its fifth terminal when a high level signal is received at the trigger signal terminal STV of the shift register unit; and to output terminal a signal received at the backward scan signal terminal BW through its fifth terminal when a high level signal is received at the end signal terminal END;

The reset module 403 is configured to output terminal a signal received at the low level signal terminal VGL of the shift register unit respectively its first terminal and third terminal when a high level signal is received at the reset signal terminal RESET of the shift register unit;

The output terminal module 402 is configured to store a high level signal and output terminal a signal received at the first signal terminal CK of the shift register unit through the output terminal GOUT of the shift register unit when the high level signal is received through its second terminal; and to store a low level signal and stop the signal received at the first signal terminal CK of the shift register unit from being output terminal through the output terminal GOUT of the shift register unit when the low level signal is received through its second terminal; and The pull-down module 404 is configured to output terminal a signal received at the low level signal terminal VGL of the shift register unit respectively through its first terminal and fourth terminal when a low level signal is received at its first terminal and a high level signal is received at its fifth terminal; and to output terminal a low level signal received at its second terminal through its fourth terminal when a high level signal is received at the second signal terminal CKB of the shift register unit.

The respective modules in the shift register unit above are structured particularly as follows:

The drive module 401 includes a first transistor M1 and a second transistor M2;

A first pole of the first transistor M1 is the first terminal of the drive module 401, a gate of the first transistor M1 is the second terminal of the drive module 401, and a second pole of the first transistor M1 is the fifth terminal of the drive module 401; and a first pole of the second transistor M2 is the fourth terminal of the drive module 401, a gate of the second transistor M2 is the third terminal of the drive module 401, and a second pole of the second transistor M2 is the fifth terminal of the drive module 401;

The first transistor M1 is configured to transmit a signal received at the forward scan signal terminal FW of the shift register unit to the fifth terminal of the drive module 401 when a high level signal is received at the trigger signal terminal STV of the shift register unit; and to be turned off and stop the signal received at the forward scan signal terminal FW of the shift register unit from being transmitted to the fifth terminal of the drive module 401 when a low level signal is received at the trigger signal terminal STV of the shift register unit;

The second transistor M2 is configured to transmit a signal received at the backward scan signal terminal BW of the shift register unit to the fifth terminal of the drive module 401 when a high level signal is received at the end signal terminal END of the shift register unit; and to be turned off and stop the signal received at the backward scan signal terminal BW from being transmitted to the fifth terminal of the drive module 401 when a low level signal is received at the end signal terminal END of the shift register unit.

The pull-down module 404 includes a first capacitor C1, a third transistor M3, a fourth transistor M4, a fifth transistor M5 and a sixth transistor M6;

A first pole of the third transistor M3 is the second terminal of the pull-down module 404, a gate of the third transistor M3 is one terminal of the second capacitor C2, and a second pole of the third transistor M3 is the first terminal of the pull-down module 404; the other terminal of the second capacitor C2 which is not connected with the gate of the third transistor M3 is the fifth terminal of the pull-down module 404; a first pole of the fourth transistor M4 is the second terminal of the pull-down module 404, a gate of the fourth transistor M4 is the first terminal of the pull-down module 404, and a second pole of the fourth transistor M4 is connected with the gate of the third transistor M3; a first pole of the fifth transistor M4 is the second terminal of the pull-down module 404, a gate of the fifth transistor M5 is connected with the gate of the third transistor M3, and a second pole of the fifth transistor M5 is the fourth terminal of the pull-down module 404; and a first pole of the sixth transistor M6 is the second terminal of the pull-down module 404, a gate of the sixth transistor M6 is the third terminal of the pull-down module 404, and a second pole of the sixth transistor M6 is the fourth terminal of the pull-down module 404;

The third transistor M3 is configured to be turned on and pull the first terminal of the pull-down module 404 down to a low level when its gate is at a high level, and to be turned off when its gate is at a low level;

The fourth transistor M4 is configured to be turned on and pull the gate of the third transistor M3 down to a low level when the first terminal of the pull-down module 404 is at a high level, and to be turned off when the first terminal of the pull-down module 404 is at a low level;

The fifth transistor M5 is configured to be turned on and pull the output terminal terminal GOUT of the shift register unit down to a low level when its gate is at a high level, and to be turned off when its gate is at a low level;

The sixth transistor M6 is configured to be turned on and pull the output terminal terminal GOUT of the shift register unit down to a low level when a high level signal is received at the second signal terminal CKB of the shift register unit, and to be turned off when a low level signal is received at the second signal terminal CKB.

The reset module 403 includes a seventh transistor M7 and an eighth transistor M8;

A first pole of the seventh transistor M7 is the fourth terminal of the reset module 403, a gate of the seventh transistor M7 is the second terminal of the reset module 403, and a second pole of the seventh transistor M7 is the first terminal of the reset module 403; and a first pole of the eighth transistor M8 is the fourth terminal of the reset module 403, a gate of the eighth transistor M8 is the second terminal of the reset module 403, and a second pole of the fourth transistor M4 is the third terminal of the reset module 403;

The seventh transistor M7 is configured to be turned on and transmit a signal received at the fourth terminal of the reset module 403 to the first terminal of the reset module 403 when a high level signal is received at the reset signal terminal RESET of the shift register unit, and to be turned off when a low level signal is received at the reset signal terminal RESET of the shift register unit;

The eighth transistor M8 is configured to be turned on and transmit a signal received at the low level signal terminal VGL to the third terminal of the reset module 403 when a high level signal is received at the reset signal terminal RESET of the shift register unit, and to be turned off when a low level signal is received at the reset signal terminal RESET of the shift register unit.

The output terminal module 402 includes a ninth transistor and a second capacitor C2;

A first pole of the ninth transistor is the first terminal of the output terminal module 402, a gate of the ninth transistor is one terminal of the second capacitor C2, the gate of the ninth transistor is the second terminal of the output terminal module 402, a second pole of the ninth transistor is the third terminal of the output terminal module 402, and the other terminal of the second capacitor C2 is the second terminal of the ninth transistor;

The ninth transistor is configured to be turned on and transmit a signal received at the first signal terminal CK to the output terminal terminal GOUT of the ninth transistor when its gate is at a high level, and to be turned off when its gate is at a low level; and The second capacitor C2 is configured to store a signal at the gate of the ninth transistor.

Figure 5:
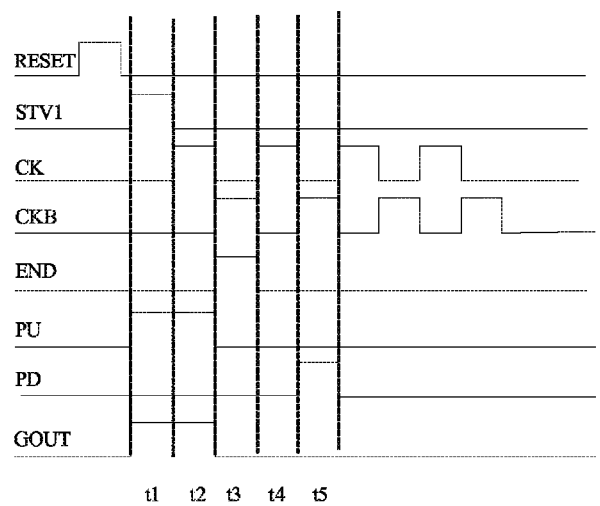
FIG. 5 illustrates a control timing diagram of the shift register unit illustrated in FIG. 4.

Referring to FIG. 5, a timing diagram of the shift register unit as illustrated in FIG. 4 is as follows:

Firstly the seventh transistor and the eighth transistor M8 are turned on by the reset signal RESET (a high level signal) to reset the transistor.

In a first period of time t1, the trigger signal STV is at a high level, the first transistor M1 is turned on, the second capacitor C2 is charged by the forward scan signal FW (a high level signal) through the first transistor M1, and the PU node is changed to a high level.

In a second period of time t2, the PU node is at a high level, so the ninth transistor M9 is turned on, and the clock signal CK (a high level signal) of this period of time t2 is transmitted to the output terminal GOUT, where the clock signal CK is a signal complementary to the clock signal CKB, so the CKB is at a low level when the CK is at a high level, and vice versa, and the low level signal VGL is transmitted to the PD node through the fourth transistor M4 to turn off the third transistor M3 and the fifth transistor M5.

In a third period of time t3, the backward trigger signal END is at a high level, the second transistor M2 is turned on, the backward scan signal BW (a low level signal) is transmitted to the second capacitor C2 through the second transistor M2, and the PU node is changed to a low level.

In a fourth period of time t4, the clock signal CKB is at a high level whereas the clock signal CK is at a low level, the sixth transistor M6 is turned on, and the low level signal VGL is transmitted to the output terminal GOUT through the sixth transistor M6.

In a fifth period of time t5, the clock signal CK is at a high level whereas the clock signal CKB is at a low level, the PU node at a low level is pulled up to a high level through coupling by the first capacitor, a low level signal VGL is transmitted to the PU node through the third transistor M3 to turn off the ninth transistor M9, and the low level signal VGL is transmitted to the output terminal GOUT through the fifth transistor M5 to keep the output terminal GOUT at a low level signal.

Timings of the gate drive circuit as illustrated in FIG. 2 and FIG. 3 will be described below with reference to the shift register unit as illustrated in FIG. 4 and the timing diagram of the shift register unit as illustrated in FIG. 5.

Figure 6:
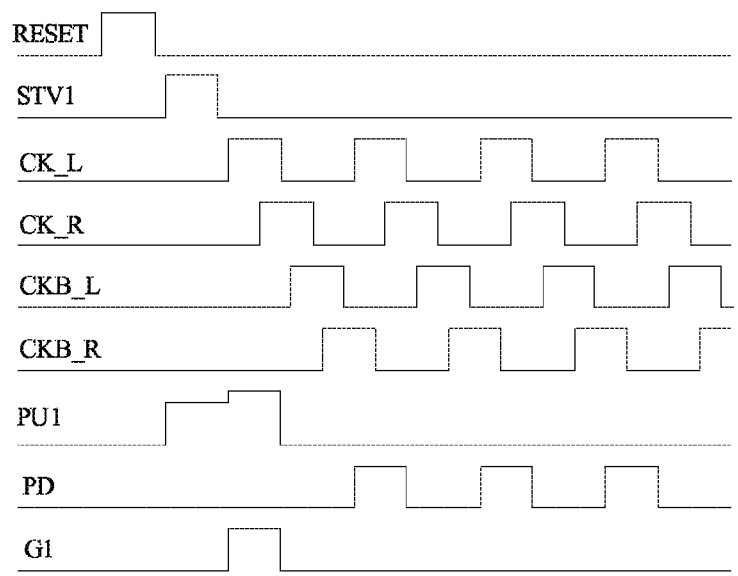
FIG. 6 illustrates a timing diagram of the shift register unit illustrated in FIG. 4 together with the gate drive circuit illustrated in FIG. 1.

Taking the gate drive circuit controlled by a 4-phase clock signal as an example, as illustrated in FIG. 6 which is a timing diagram of the gate drive circuit in the prior art as illustrated in FIG. 1, the output terminal signal G1 is an output terminal from the first shift register unit, where the PU nodes start to be charged since the trigger signal STV1 becomes a high level until the first shift register unit output terminals a low level signal where the PUs node stops from being charged. The PU nodes of the other shift register units are charged for the same period of time as illustrated in FIG. 6, which is relatively long, thus resulting in significant power consumption of the gate drive circuit.

Figure 7:
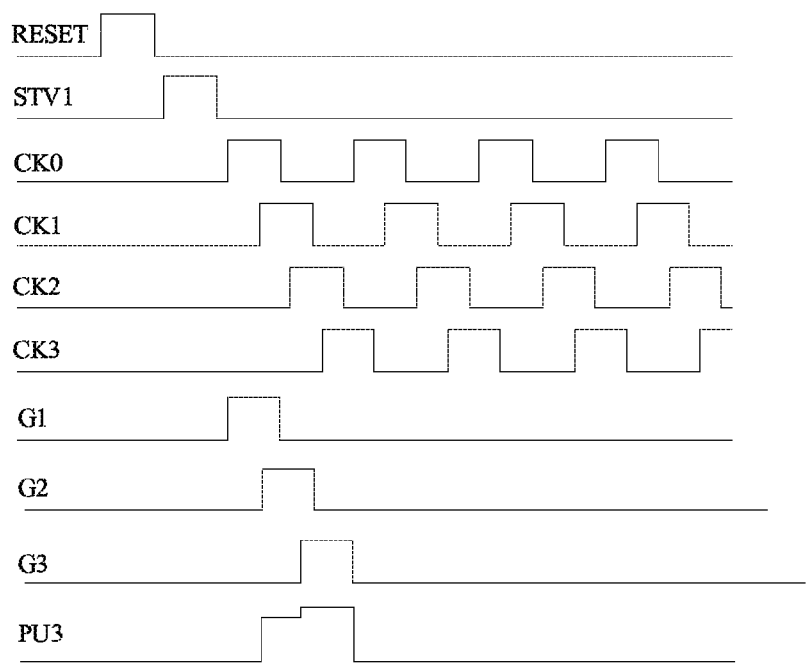
FIG. 7 illustrates a timing diagram of the shift register unit illustrated in FIG. 4 together with the gate drive circuit illustrated in FIG. 2.

As illustrated in FIG. 7 which is a timing diagram of the gate drive circuit controlled by a 4-phase clock signal as illustrated in FIG. 2, a period of time for which the third shift register unit is charged will be described as an example.

The first signal terminal CK of the third shift register unit G3 receives the second clock signal CK2, the second signal terminal CKB of the third shift register unit G3 receives the zero-th clock signal CK0, and the trigger signal terminal STV of the third shift register unit G3 receives an output terminal signal from the output terminal GOUT of the second shift register unit G2; and since the i-th clock signal lags the (i−1)-th clock signal by more than $\frac{1}{2}^M$ clock cycle and less than one clock cycle, where i=1, 2, . . . , $2^{M-1}$, there will be also differences in phase corresponding to output terminals of the respective shift register units, that is, an output terminal signal of the third shift register unit G3 lags the output terminal signal of the second shift register unit G2 by more than $\frac{1}{2}^M$ clock cycle, so that the third shift register unit G3 starts to be charged when the second shift register unit G2 starts to output terminal a high level signal, and the third shift register unit G3 stops from being charged when the second shift register unit G2 stops the high level signal from being output terminal, thus shortening the period of time for charging, and consequentially lowering the power consumption of the gate drive circuit, as compared with the prior art.

Figure 8:
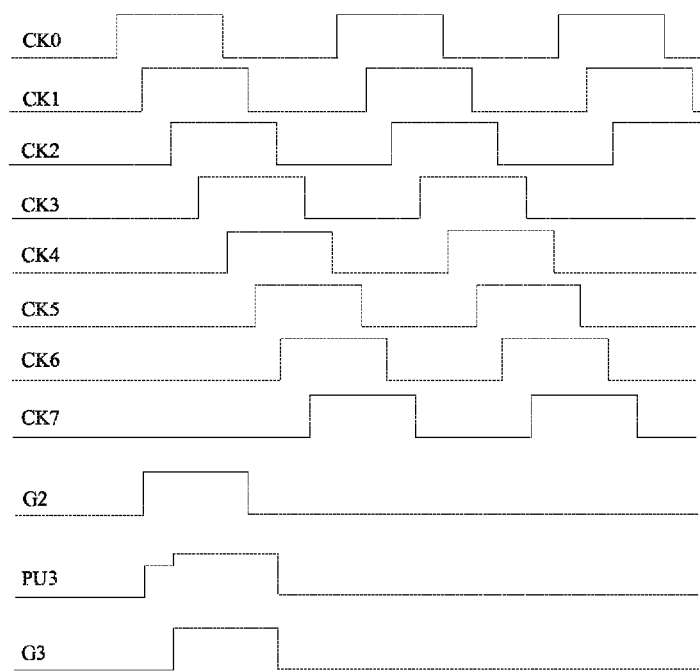
FIG. 8 illustrates a timing diagram of the shift register unit illustrated in FIG. 4 together with the gate drive circuit illustrated in FIG. 3.

As illustrated in FIG. 8 which is a timing diagram of the gate drive circuit controlled by an 8-phase clock signal as illustrated in FIG. 3, a period of time for which the third shift register unit is charged will be described as an example.

The first signal terminal CK of the third shift register unit G3 receives the second clock signal CK2, the second signal terminal CKB of the third shift register unit G3 receives the sixth clock signal CK6, and the trigger signal terminal STV of the third shift register unit G3 receives an output terminal signal from the output terminal GOUT of the second shift register unit G2; and since the i-th clock signal lags the (i−1)-th clock signal by more than $\frac{1}{2}^M$ clock cycle and less than one clock cycle, where i=1, 2, . . . , $2^M$−1, there will be also differences in phase corresponding to output terminals of the respective shift register units, that is, an output terminal signal of the third shift register unit G3 lags the output terminal signal of the second shift register unit G2 by more than $\frac{1}{2}^M$ clock cycle, so that the third shift register unit G3 starts to be charged when the second shift register unit G2 starts to output terminal a high level signal, and the third shift register unit G3 stops from being charged when the second shift register unit G2 stops the high level signal from being output terminal, thus shortening the period of time for charging, and consequentially lowering the power consumption of the gate drive circuit, as compared with the prior art.

Advantageous effects of the embodiments of the disclosure are as follows: the trigger signal terminal of the p-th shift register unit receives an output terminal signal from the output terminal of the (p−1)-th shift register unit, and the end signal terminal of the r-th shift register unit receives an output terminal signal from the output terminal of the (r+$2^{M-1}$)-th shift register unit, so that the number of initial trigger signal lines can be lowered and a wire space taken up by a signal line on which a trigger signal is passed between one shift register unit and another shift register unit dependent thereupon can be saved; and moreover the trigger signal terminal of the p-th shift register unit receives an output terminal signal from the output terminal of the (p−1)-th shift register unit, so that each shift register unit is charged for a shorter period of time, and as compared with driving every other row in the prior art, the shift register units can be charged at a high level for a shorter period of time to thereby greatly lower the power consumption.

Figure 9:
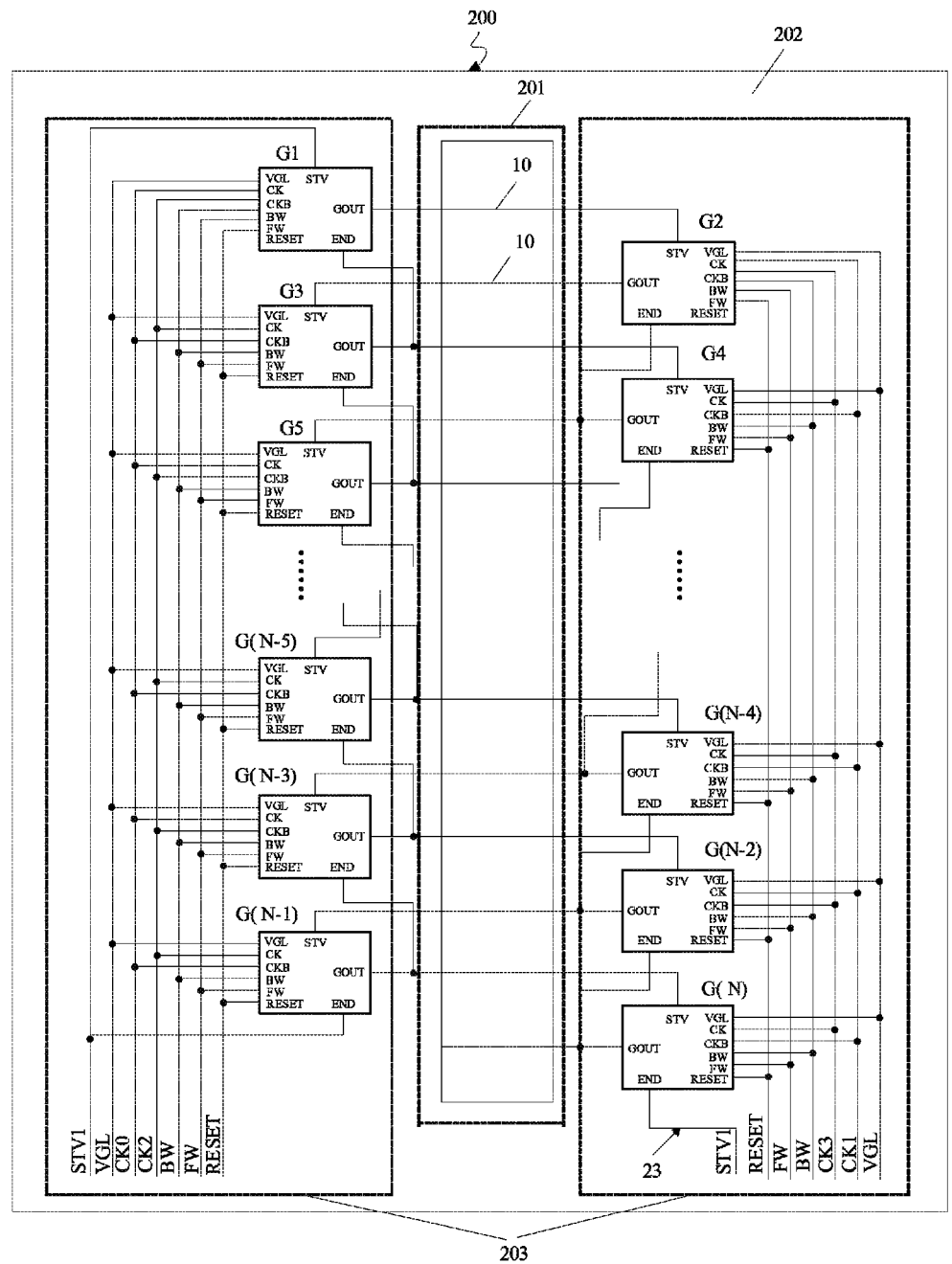
FIG. 9 illustrates a schematic diagram of an array substrate according to an embodiment of the disclosure.

Referring to FIG. 9, an embodiment of the disclosure provides an array substrate 200 including a display area 201 in which N gate lines 10 are arranged, and an array substrate, a non-display area 202 surrounding the display area 201, on which the gate drive circuit 203 according to the embodiments above are arranged.

The respective shift register units connected with the odd gate lines 2 are arranged in the non-display area 202 to the left of the display area 201, and the respective shift register units connected with the even gate lines 2 are arranged in the non-display area 202 to the right of the display area 201.

Of course, alternatively the respective shift register units connected with the odd gate lines 2 are arranged in the non-display area 202 to the right of the display area 201, and the respective shift register units connected with the even gate lines 2 are arranged in the non-display area 202 to the left of the display area 201, but a repeated description thereof will be omitted here.

Advantageous effects of the embodiment of the disclosure are as follows: the trigger signal terminal of the p-th shift register unit receives an output terminal signal from the output terminal of the (p−1)-th shift register unit, and the end signal terminal of the r-th shift register unit receives an output terminal signal from the output terminal of the (r+$2^{M-1}$)-th shift register unit, so that the number of initial trigger signal lines can be lowered and a wire space taken up by a signal line on which a trigger signal is passed between one shift register unit and another shift register unit dependent thereupon can be saved; and moreover the trigger signal terminal of the p-th shift register unit receives an output terminal signal from the output terminal of the (p−1)-th shift register unit, so that each shift register unit is charged for a shorter period of time, and as compared with driving every other row in the prior art, the shift register units can be charged at a high level for a shorter period of time to thereby greatly lower the power consumption.

Figure 10:
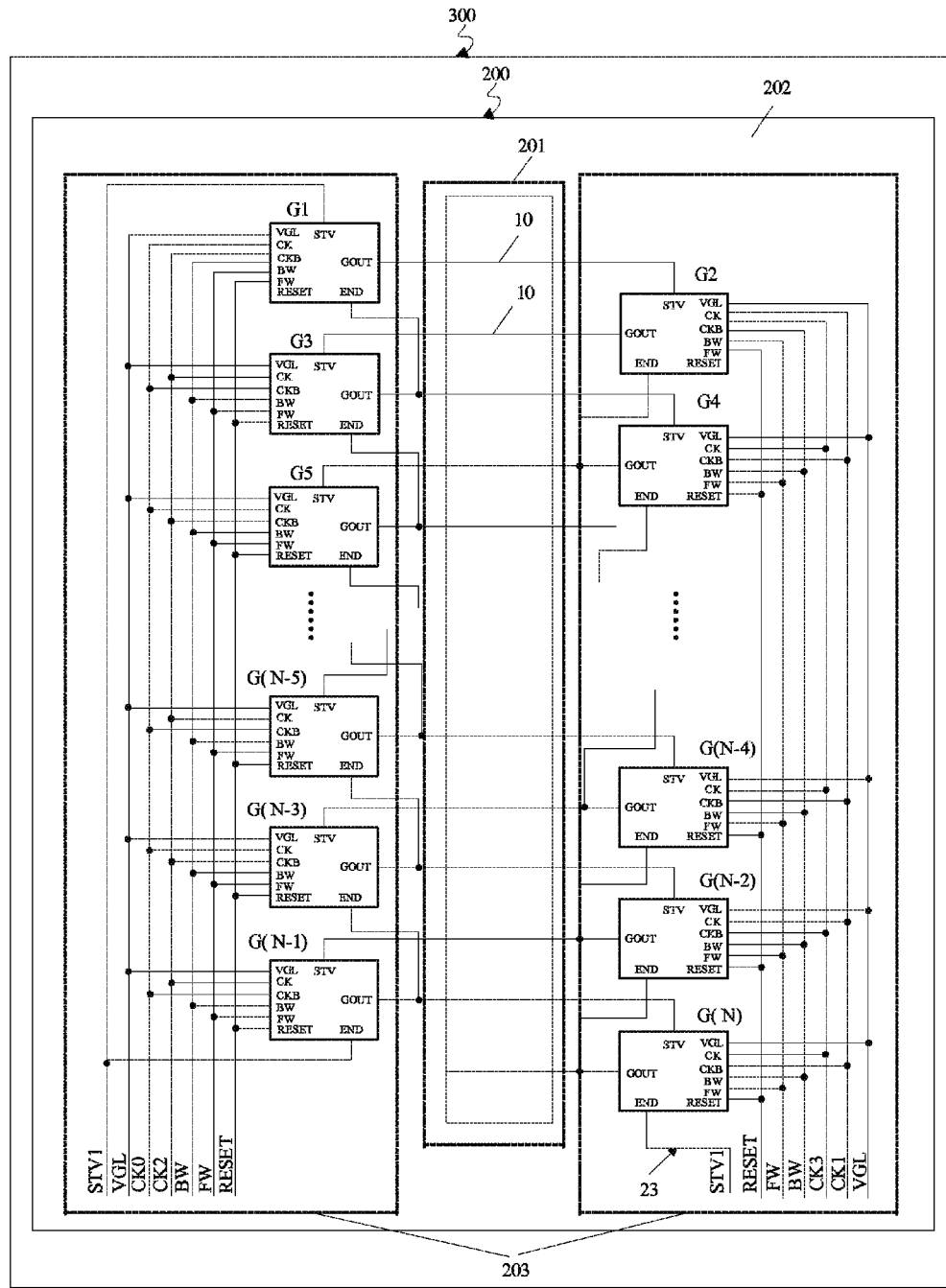
FIG. 10 illustrates a schematic diagram of a display panel according to an embodiment of the disclosure.

Referring to FIG. 10, an embodiment of the disclosure provides a display panel 300 including the array substrate 200 according to the embodiment above of the disclosure. Advantageous effects of the embodiment of the disclosure are as follows: the trigger signal terminal of the p-th shift register unit receives an output terminal signal from the output terminal of the (p−1)-th shift register unit, and the end signal terminal of the r-th shift register unit receives an output terminal signal from the output terminal of the (r+$2^{M-1}$)-th shift register unit, so that the number of initial trigger signal lines can be lowered and a wire space taken up by a signal line on which a trigger signal is passed between one shift register unit and another shift register unit dependent thereupon can be saved; and moreover the trigger signal terminal of the p-th shift register unit receives an output terminal signal from the output terminal of the (p−1)-th shift register unit, so that each shift register unit is charged for a shorter period of time, and as compared with driving every other row in the prior art, the shift register units can be charged at a high level for a shorter period of time to thereby greatly lower the power consumption.

Figure 11:
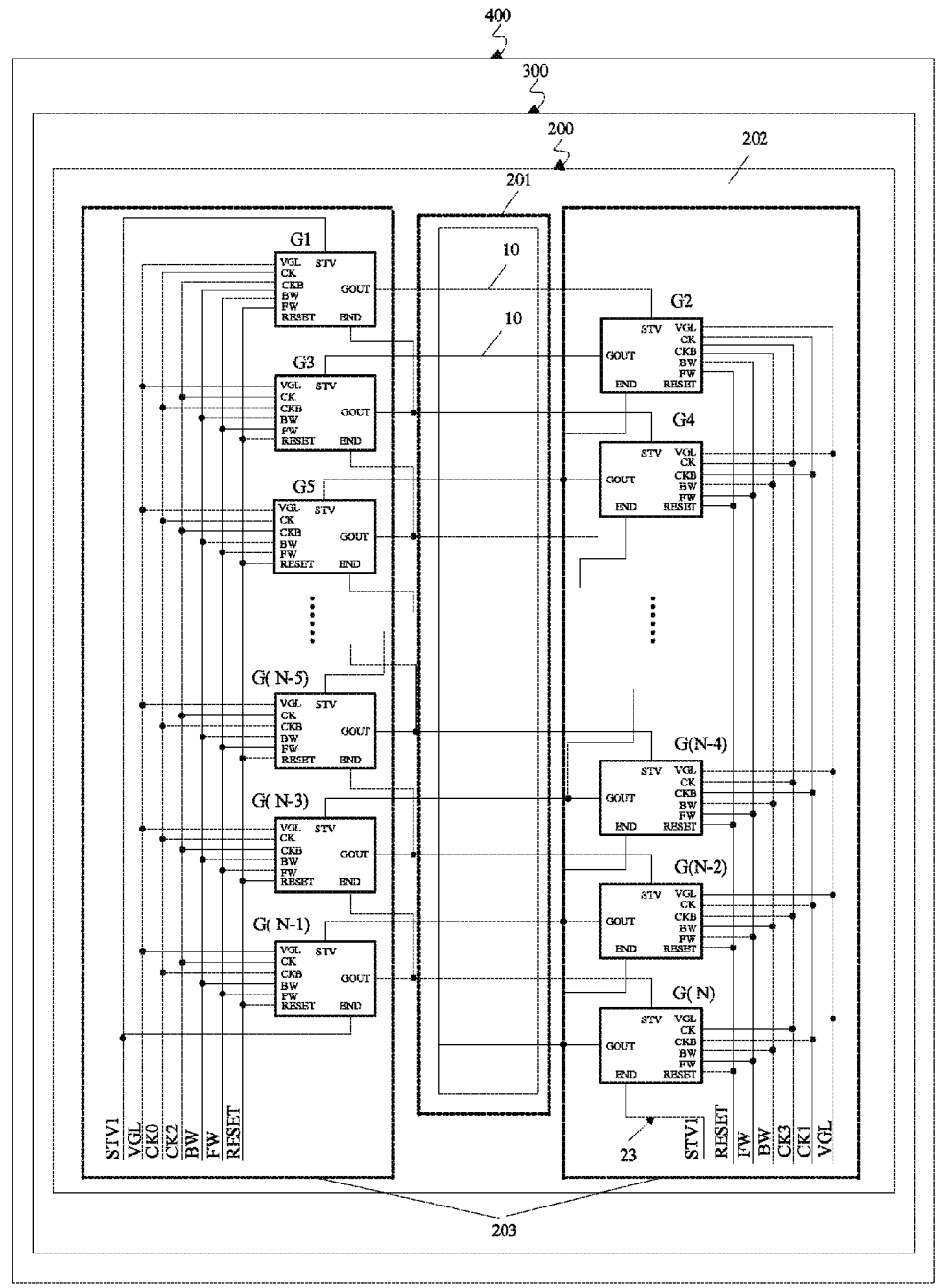
FIG. 11 illustrates a schematic diagram of a display device according to an embodiment of the disclosure.

Referring to FIG. 11, an embodiment of the disclosure provides a display device 400 including the display panel 300 according to the embodiment above of the disclosure.

Advantageous effects of the embodiment of the disclosure are as follows: the trigger signal terminal of the p-th shift register unit receives an output terminal signal from the output terminal of the (p−1)-th shift register unit, and the end signal terminal of the r-th shift register unit receives an output terminal signal from the output terminal of the (r+$2^{M-1}$)-th shift register unit, so that the number of initial trigger signal lines can be lowered and a wire space taken up by a signal line on which a trigger signal is passed between one shift register unit and another shift register unit dependent thereupon can be saved; and moreover the trigger signal terminal of the p-th shift register unit receives an output terminal signal from the output terminal of the (p−1)-th shift register unit, so that each shift register unit is charged for a shorter period of time, and as compared with driving every other row in the prior art, the shift register units can be charged at a high level for a shorter period of time to thereby greatly lower the power consumption.

Evidently those skilled in the art can make various modifications and variations to the disclosure without departing from the essence and scope of the disclosure. Thus the disclosure is also intended to encompass these modifications and variations thereto so long as the modifications and variations come into the scope of the claims appended to the disclosure and their equivalents.

What is claimed is:

1. A gate drive circuit, comprising:
N shift register units, each of which is connected with one of N gate lines of a display panel respectively; and
$2^M$ clock signal lines configured to provide the N shift register units with clock signals, wherein each of the N shift register units is connected with exactly $2^M/2$ clock signal lines,
wherein:
N is an even number, and M is a natural number larger than or equal to 2,
a trigger signal terminal of the first shift register unit is connected with a first initial trigger signal line, and a trigger signal terminal of the p-th shift register unit is connected with an output terminal of the (p−1)-th shift register unit, wherein p=2, 3, . . . , N, an end signal terminal of the r-th shift register unit is connected with an output terminal of the $(r+2^{M-1})$-th shift register unit, wherein $r=1, 2, \ldots, N-2^{M-1}$, a plurality of low level signal terminals of the shift register units are connected with a first low level signal line, a plurality of reset signal terminals of the shift register units are connected with a reset signal line, forward scan signal terminals of the shift register units are connected with a first scan signal line, backward scan signal terminals of the shift register units are connected with a second scan signal line, and the trigger signal terminal of the p-th shift register unit is connected with the output terminal of the (p−1)-th shift register unit through the (p−1)-th gate line.

2. The gate drive circuit of claim 1, wherein a first signal terminal of the k-th shift register unit is connected with the $\mathrm{mod}(\mathrm{mod}(k-1)/2^M)/2^M)$-th clock signal line, and a second signal terminal of the k-th shift register unit is connected with the $\mathrm{mod}((\mathrm{mod}(k-1)/2^M+2^{M-1})/2^M)$-th clock signal line, wherein $k=1, 2, 3, \ldots, N$, wherein mod denotes the remainder after division.

3. The gate drive circuit of claim 2, wherein the clock signal on the i-th clock signal line lags the clock signal on the (i−1)-th clock signal line by more than $\frac{1}{2}^M$ clock cycle and less than one clock cycle, wherein $i=1, 2, \ldots, 2^M-1$.

4. The gate drive circuit of claim 1, wherein during a forward scan, the first scan signal line provides a high level signal and the second scan signal line provides a low level signal.

5. The gate drive circuit of claim 1, wherein the end signal terminals of the last $2^{M-1}$ shift register units of the gate drive circuit are connected with the first initial trigger signal line.

6. An array substrate, comprising:

a display area; and a non-display area surrounding the display area, wherein N gate lines are arranged in the display area, and a gate drive circuit is arranged in the non-display area, wherein the gate drive circuit comprises:

N shift register units, each of which is connected with one of N gate lines of a display panel respectively; and $2^M$ clock signal lines configured to provide the N shift register units with clock signals, wherein each of the N shift register units is connected with exactly $2^M/2$ clock signal lines, wherein:

N is an even number, and M is a natural number larger than or equal to 2, a trigger signal terminal of the first shift register unit is connected with a first initial trigger signal line, and a trigger signal terminal of the p-th shift register unit is connected with an output terminal of the (p−1)-th shift register unit, wherein $p=2, 3, \ldots, N$, an end signal terminal of the r-th shift register unit is connected with an output terminal of the $(r+2^{M-1})$-th shift register unit, wherein $r=1, 2, \ldots, N-2^{M-1}$, a plurality of low level signal terminals of the shift register units are connected with a first low level signal line, a plurality of reset signal terminals of the shift register units are connected with a reset signal line, forward scan signal terminals of the shift register units are connected with a first scan signal line, backward scan signal terminals of the shift register units are connected with a second scan signal line, and the trigger signal terminal of the p-th shift register unit is connected with the output terminal of the (p−1)-th shift register unit through the (p−1)-th gate line.

7. The array substrate of claim 6, wherein a first signal terminal of the k-th shift register unit is connected with the $\mathrm{mod}(\mathrm{mod}(k-1)/2^M)/2^M)$-th clock signal line, and a second signal terminal of the k-th shift register unit is connected with the $\mathrm{mod}((\mathrm{mod}(k-1)/2^M+2^{M-1})/2^M)$-th clock signal line, wherein $k=1, 2, 3, \ldots, N$, wherein mod denotes the remainder after division.

8. The array substrate of claim 7, wherein the clock signal on the i-th clock signal line lags the clock signal on the (i−1)-th clock signal line by more than $\frac{1}{2}^M$ clock cycle and less than one clock cycle, wherein $i=1, 2, \ldots, 2^M-1$.

9. The array substrate of claim 6, wherein during a forward scan, the first scan signal line provides a high level signal and the second scan signal line provides a low level signal.

10. The array substrate of claim 6, wherein the respective shift register units connected with the odd gate lines are arranged in the non-display area to the left of the display area, and the respective shift register units connected with the even gate lines are arranged in the non-display area to the right of the display area.

11. The array substrate of claim 6, wherein the respective shift register units connected with the odd gate lines are arranged in the non-display area to the right of the display area, and the respective shift register units connected with the even gate lines are arranged in the non-display area to the left of the display area.

12. A display panel, comprising an array substrate, wherein the array substrate comprises a display area and a non-display area surrounding the display area, wherein N gate lines are arranged in the display area, and a gate drive circuit is arranged in the non-display area, wherein the gate drive circuit comprises:

N shift register units, each of which is connected with one of N gate lines of a display panel respectively; and $2^M$ clock signal lines configured to provide the N shift register units with clock signals, wherein each of the N shift register units is connected with exactly $2^M/2$ clock signal lines, wherein:

N is an even number, and M is a natural number larger than or equal to 2, a trigger signal terminal of the first shift register unit is connected with a first initial trigger signal line, and a trigger signal terminal of the p-th shift register unit is connected with an output terminal of the (p−1)-th shift register unit, wherein $p=2, 3, \ldots, N$, an end signal terminal of the r-th shift register unit is connected with an output terminal of the $(r+2^{M-1})$-th shift register unit, wherein $r=1, 2, \ldots, N-2^{M-1}$, a plurality of low level signal terminals of the shift register units are connected with a first low level signal line, a plurality of reset signal terminals of the shift register units are connected with a reset signal line, forward scan signal terminals of the shift register units are connected with a first scan signal line, backward scan signal terminals of the shift register units are connected with a second scan signal line, and the trigger signal terminal of the p-th shift register unit is connected with the output terminal of the (p−1)-th shift register unit through the (p−1)-th gate line.

13. A display device, comprising a display panel, wherein the display panel comprises an array substrate, wherein the array substrate comprises a display area and a non-display area surrounding the display area, wherein there N gate lines are arranged in the display area, and a gate drive circuit is arranged in the non-display area, wherein the gate drive circuit comprises:

N shift register units, each of which is connected with one of N gate lines of a display panel respectively; and $2^M$ clock signal lines configured to provide the N shift register units with clock signals, wherein each of the N shift register units is connected with exactly $2^M/2$ clock signal lines, wherein:

N is an even number, and M is a natural number larger than or equal to 2, a trigger signal terminal of the first shift register unit is connected with a first initial trigger signal line, and a trigger signal terminal of the p-th shift register unit is connected with an output terminal of the (p−1)-th shift register unit, wherein p=2, 3, . . . , N, an end signal terminal of the r-th shift register unit is connected with an output terminal of the (r+$2^{M-1}$)-th shift register unit, wherein r=1, 2, . . . , N−$2^{M-1}$, a plurality of low level signal terminals of the shift register units are connected with a first low level signal line, a plurality of reset signal terminals of the shift register units are connected with a reset signal line, forward scan signal terminals of the shift register units are connected with a first scan signal line, backward scan signal terminals of the shift register units are connected with a second scan signal line, and the trigger signal terminal of the p-th shift register unit is connected with the output terminal of the (p−1)-th shift register unit through the (p−1)-th gate line.

\* \* \* \* \*